(12) United States Patent
Cho et al.

(10) Patent No.: US 7,663,403 B2
(45) Date of Patent: Feb. 16, 2010

(54) HIGH-SPEED ASYNCHRONOUS DIGITAL SIGNAL LEVEL CONVERSION CIRCUIT

(75) Inventors: Min Hyung Cho, Daejeon (KR); Kwi Dong Kim, Daejeon (KR); Chong Ki Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/943,031

(22) Filed: Nov. 20, 2007

(65) Prior Publication Data

US 2008/0129338 A1 Jun. 5, 2008

(30) Foreign Application Priority Data

Dec. 5, 2006 (KR) .................... 10-2006-0122519
Jun. 13, 2007 (KR) .................... 10-2007-0057601

(51) Int. Cl.
*H03K 19/0175* (2006.01)

(52) U.S. Cl. ................... 326/81; 326/68; 327/333

(58) Field of Classification Search .............. 326/63, 326/68, 80–81; 327/333
See application file for complete search history.

(56) References Cited

U.S. PATENT DOCUMENTS

| 5,473,268 | A  | * | 12/1995 | Declercq et al. | ............. | 326/80 |
| 5,698,993 | A  | * | 12/1997 | Chow | ............................ | 326/81 |
| 6,043,699 | A  | * | 3/2000  | Shimizu | ..................... | 327/333 |
| 6,046,621 | A  | * | 4/2000  | Crowley | ..................... | 327/333 |
| 6,414,534 | B1 | * | 7/2002  | Wang et al. | .................. | 327/333 |
| 6,437,627 | B1 | * | 8/2002  | Tran et al. | .................. | 327/333 |
| 6,864,718 | B2 | * | 3/2005  | Yu | ............................. | 326/68 |
| 6,888,394 | B2 | * | 5/2005  | Cleary et al. | ................ | 327/333 |
| 7,034,572 | B2 | * | 4/2006  | Kim et al. | ..................... | 326/68 |
| 7,180,329 | B1 | * | 2/2007  | Sia et al. | ....................... | 326/81 |
| 7,224,202 | B2 | * | 5/2007  | Pauletti | ..................... | 327/333 |
| 7,310,012 | B2 | * | 12/2007 | Chen | .......................... | 327/333 |
| 7,449,933 | B2 | * | 11/2008 | Goncalves et al. | ......... | 327/333 |
| 2004/0164766 | A1 |   | 8/2004 | Yu | | |

FOREIGN PATENT DOCUMENTS

| JP | 07-193488 | 7/1995 |
| JP | 2000-091894 | 3/2000 |

(Continued)

OTHER PUBLICATIONS

F. Ishihara, et al., "Level conversion for dual-supply systems" IEEE Transactions on Very Large Scale Integration (VLSI) Systems, vol. 12, No. 2 (Feb. 2004), pp. 185-195.

(Continued)

*Primary Examiner*—Vibol Tan
*Assistant Examiner*—Jason Crawford
(74) *Attorney, Agent, or Firm*—Rabin & Berdo, PC

(57) ABSTRACT

Provided is a high-speed asynchronous digital signal level conversion circuit converting an input signal of a first voltage level into a signal of a second voltage level. The conversion circuit is able to operate at high speed by connecting first and second nodes, at which the input signal of the first voltage level is converted to the signal of the second voltage level, to a second power source voltage of the second voltage level for fast voltage level conversion when the voltage level of the input signal is changed.

4 Claims, 4 Drawing Sheets

FOREIGN PATENT DOCUMENTS

| | | |
|---|---|---|
| JP | 2004-343396 | 12/2004 |
| JP | 2006-121654 | 5/2006 |
| JP | 2006-261981 | 9/2006 |
| KR | 10-0282282 | 11/2000 |
| KR | 2006-0010358 | 2/2006 |
| KR | 2006-0106106 | 10/2006 |
| WO | 03/007477 | 1/2003 |

OTHER PUBLICATIONS

S. Kulkarni, et al., "High performance level conversion for dual VDD design" IEEE Transactions on Very Large Scale Integration (VLSI) Systems, vol. 12, No. 9 (Sep. 2004), pp. 926-936.

* cited by examiner

HIGH-SPEED ASYNCHRONOUS DIGITAL SIGNAL LEVEL CONVERSION CIRCUIT

CROSS-REFERENCE TO RELATED APPLICATION

This application claims priority to and the benefit of Korean Patent Application No. 2006-122519, filed Dec. 5, 2006, and No. 2007-57601, filed Jun. 13, 2007, the disclosure of which is incorporated herein by reference in its entirety.

BACKGROUND

1. Field of the Invention

The present invention relates to high-speed asynchronous digital signal level conversion circuits. More particularly, the present invention disclosed herein relates to a digital signal level conversion circuit operable at high speed by improving a conversion speed (or rate) of a conversion circuit for converting a low-voltage digital signal into a high-voltage digital signal between digital circuits having different power source voltages in an integrated circuit.

The present invention has been produced from the work supported by the IT R&D program of MIC (Ministry of Information and Communication)/IITA (Institute for Information Technology Advancement) [2005-S-073-02, Development of semiconductor circuit design based on the nano-scaled device] in Korea.

2. Discussion of Related Art

With an increase in power consumption in varieties of digital chips, reducing power consumption therein is regarded as an important subject toward which significant effort is being focused in order to improve power consumption rate.

In digital circuits with embedded CMOS devices, most power consumption is caused by the CMOS devices' switching operations. Dynamic power consumption P can be summarized as shown Equation 1, which is proportional to an operating frequency f and the square of a power source voltage V.

$$P \propto f \times V^2 \qquad \text{[Equation 1]}$$

Therefore, lowering a level of the power source voltage is effective in reducing power consumption in the digital circuits using CMOS devices. However, when the power source voltage is lowered in the digital circuit using CMOS devices, propagation delays lengthen to limit operation speeds thereof, as shown in Equation 2.

$$\text{Propagation\_Delay} = \frac{V_{DD}}{(V_{DD} - V_{TH})^2} \qquad \text{[Equation 2]}$$

In Equation 2, $V_{DD}$ represents the power source voltage and $V_{TH}$ represents a threshold voltage of the CMOS device.

Considering such characteristics, the digital chips using CMOS devices are usually designed to use a lower power source voltage in circuit regions operable at low speed (or low frequency), and designed to use a higher power source voltage in circuit regions operable at high speed or requiring a high voltage, such as input/output buffers, which is helpful for reducing the overall rate of power consumption in the digital chips.

In the case of using two kinds of digital circuits having different power source voltages in a digital chip, a circuit for converting a high-level digital signal into a low-level digital signal and a circuit for converting a low-level digital signal into a high-level digital signal are required for the purpose of transferring signals between circuit blocks having different power source voltages.

With such digital signal level conversion circuits, the circuit converting a high-level digital signal into a low-level digital signal has a relatively simple structure without functional degradation, such as a decrease in operation speed. In contrast, as the circuit for converting a low-level digital signal into a high-level digital signal may cause static power dissipation and reduction in operation speed, there is a need for additional circuits to compensate for such problems.

FIG. 1 is a circuit diagram showing the simplest structure of a digital signal level conversion circuit for converting a low-level digital signal into a high-level digital signal, in which an inverter of a low power source voltage is serially coupled to an inverter of a high power source voltage.

However, the digital signal level conversion circuit 100 shown in FIG. 1 has a disadvantage in that static power may be inadvertently dissipated, as explained hereinafter.

First, when a signal of 0V is applied thereto as a low-level digital input signal DL, a voltage of a first node N1 goes to a level of a low power source voltage VDDL. In this case, when the relationship among the low power source voltage VDDL, a high power source voltage VDDH, and a threshold voltage VTH of a second PMOS transistor PM2 is satisfied as shown in Equation 3, the second PMOS transistor PM2 not being turned off operates in a linear or saturation region. Then, a static current continuously flows from the high power source voltage VDDH toward the ground GND, resulting in undesired static power consumption.

$$(VDDH-VDDL) \geq (VDDH-VTH, PM\ 2) \qquad \text{[Equation 3]}$$

For the purpose of solving such a static power consumption problem, a cross-coupled level converter (CCLC) shown in FIG. 2 is a typical structure which is widely used for asynchronous digital signal level conversion.

FIG. 2 is a circuit diagram of a conventional digital signal level conversion circuit 200, and FIG. 3 is a timing diagram of the digital signal level conversion circuit 200 shown in FIG. 2.

The digital signal level conversion circuit 200 having the CCLC structure has problems in that a conversion speed of converting from a low level to a high level is slow at nodes N1 and N2 corresponding to drains of input transistors NM1 and NM2 when a low-level input signal DL changes to a low level from a high level, and the conversion speed become slower when an input low voltage digital signal level becomes lower relative to a high voltage digital signal level.

The reason for the slow conversion speed is as follows.

When an input signal DL of the signal level conversion circuit 200 shown in FIG. 2 is the low power source voltage VDDL (i.e., high level voltage of logic '1'), a first NMOS transistor NM1 and the second PMOS transistor PM2 are turned on while a second NMOS transistor NM2 and a first PMOS transistor PM1 are turned off. Thus, the first node N1 is set to 0V and the second node N2 is set to the high power source voltage VDDH. In this case, when the input signal DL goes to 0V (i.e., low level voltage of logic '0') from the low power source voltage VDDL, the first NMOS transistor NM1 is turned off first to set the first node N1 to high impedance. At the same time, as an inverted input signal DLB turns to the level of the low power source voltage VDDL from 0V, the second NMOS transistor NM2 is turned on to change the second node N2 to 0V. Thereby, the first PMOS transistor PM1 is turned on to change a voltage of the first node N1 to the level of the high power source voltage VDDH.

Since the voltages of the nodes change through the aforementioned operation process, the voltage of the first node N1 goes to the high power source voltage VDDH from 0V after a time delay, as shown in FIG. 3, even if the input signal DL changes to 0V from the level of the low power source voltage VDDL.

In other words, when a gate of the first NMOS transistor NM1 is applied with the digital input signal DL that changes to 0V from the low power source voltage VDDL, it takes a long time to change a drain voltage of the first NMOS transistor NM1 to the high power source voltage VDDH from 0V, and the signal level conversion speed becomes slower as the low power source voltage VDDL becomes lower than the high power source voltage VDDH. This effect occurs in the same pattern at the second node N2 when the low-level input signal DL changes to the low power source voltage VDDL from 0V.

Such a conversion speed degradation problem in the digital signal level conversion circuit limits the overall operation speed that is necessary for the digital chip to operate at high speed. As a result, there are disadvantages in that the overall performance of the digital chip is worse, and that the technique for operating some circuits of the digital chip in the low power source voltage is inapplicable.

SUMMARY OF THE INVENTION

The present invention is directed to a high-speed asynchronous digital signal level conversion circuit capable of operating faster in the same condition by improving a signal level conversion speed.

The present invention is also directed to a high-speed asynchronous digital signal level conversion circuit capable of implementing a low-power digital circuit and chip by enabling fast signal level conversion even at a low input voltage.

One aspect of the present invention provides a high-speed asynchronous digital signal level conversion circuit including: a signal level converter for converting an input signal of a first voltage level into a signal of a second voltage level; and a switching circuit for connecting first and second nodes, at which the input signal of the first voltage level is converted to the signal of the second voltage level, to a second power source voltage of the second voltage level for fast voltage level conversion when the voltage level of the input signal is changed.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. Therefore, the following embodiments are described in order for this disclosure to be complete and enabling to those of ordinary skill in the art.

Figure 4:
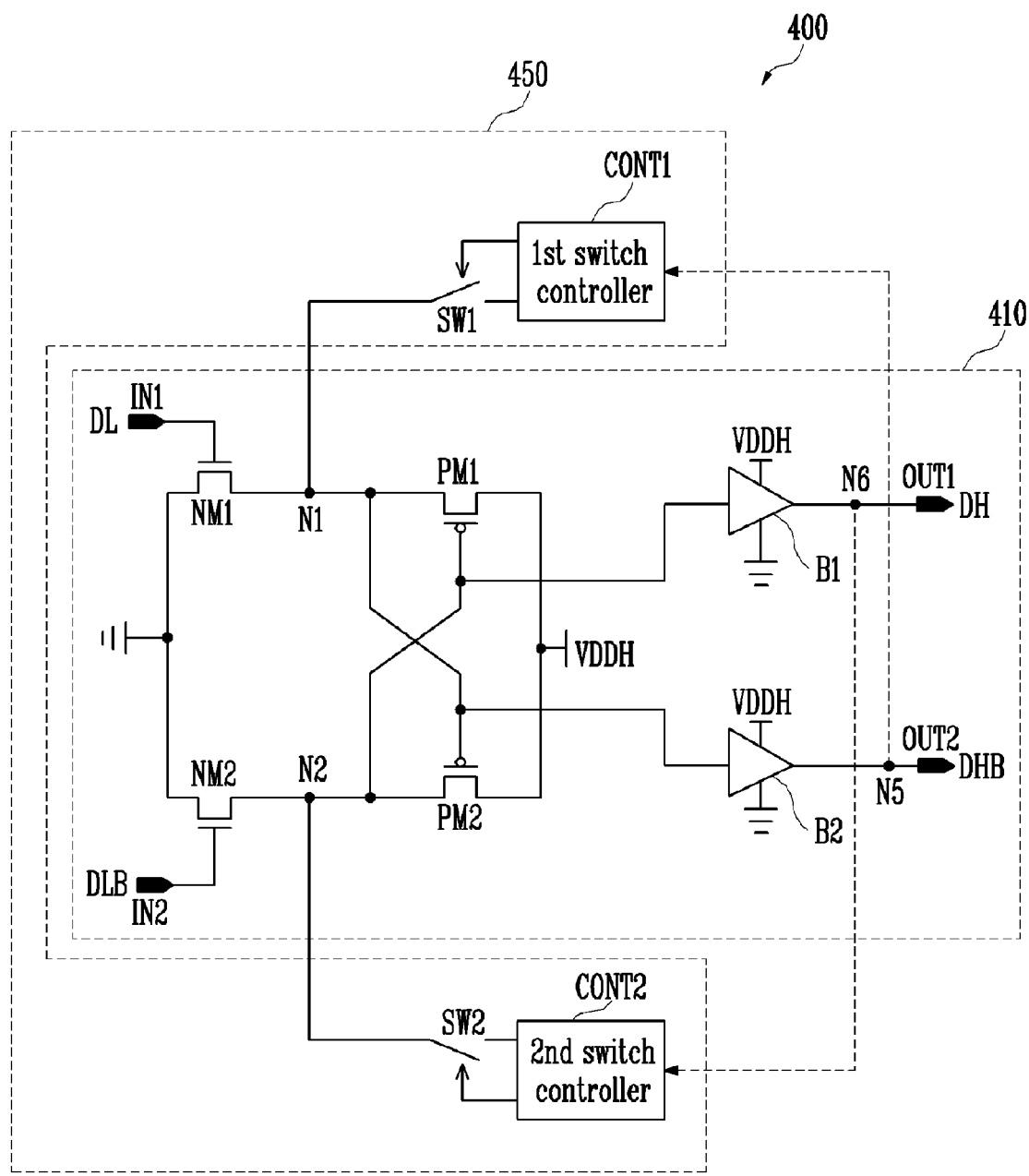
FIG. 4 is a schematic circuit diagram of a high-speed asynchronous digital signal level conversion circuit in accordance with the present invention.

FIG. 4 is a schematic circuit diagram of a high-speed asynchronous digital signal level conversion circuit 400 in accordance with the present invention.

As shown in FIG. 4, the high-speed asynchronous digital signal level conversion circuit 400 comprises a signal level converter 410 converting low-level input signals DL and DLB into high-level output signals DHB and DH, and a switching circuit 450 coupling the high power source voltage VDDH to first and second nodes where the low-level input signals DL and DLB are converted into the high-level output signals DHB and DH. The switching circuit 450 contributes to fast signal level conversion of the low-level input signals DL and DLB.

The signal level converter 410 includes cross-coupled first and second PMOS transistors PM1 and PM2 connected between the high power source voltage VDDH and the first and second nodes N1 and N2, first and second NMOS transistors NM1 and NM2 connected between the first and second nodes N1 and N2 and the ground voltage and the first and second NMOS transistors' gates are coupled to the input signal DL and an inverted input signal DLB, respectively, and buffers B1 and B2 transferring signals to output terminals N5 and N6 from the first and second nodes N1 and N2.

While this embodiment is designed to receive the low-level input signals DL and DLB (DLB is the inverse of DL) through the first and second input terminals IN1 and IN2, respectively, and to output the high-level input signals DH and DHB (DHB is the inverse of DH) through the first and second output terminals OUT1 and OUT2, it is also possible to design the circuit in a structure such that inverters are employed to obtain the inverted input and inverted output signals DLB and DHB, respectively, by inversing the input and output signals DL and DH.

The switching circuit 450 includes first and second switch controllers CONT1 and CONT2 outputting control signals by detecting voltage values of the first and second nodes N1 and N2 (i.e., variations in drain voltages from the first and second NMOS transistors NM1 and NM2), and first and second switches SW1 and SW2 each connected to the drains of the first and second NMOS transistors NM1 and NM2 and turned on/off in response to the control signals.

As shown in FIG. 4, the high-speed asynchronous digital signal level conversion circuit 400 is featured in the configuration formed by adding the first and second switches SW1 and SW2 and the first and second switch controllers CONT1 and CONT2 to the CCLC-structured digital signal level conversion circuit shown in FIG. 2, providing a faster operation by improving a signal level conversion speed, which will be further detailed hereinafter.

As described above, when the low-level input signals DL and DLB varies, one of gate inputs of the first and second NMOS transistors NM1 and NM2 changes to 0V. In this case, it takes a long time to change the drain voltages of the first and second NMOS transistors NM1 and NM2 from 0V to the level of the high power source voltage VDDH, which limits the overall operation speed of the digital chip and disables to operate some circuits of the digital chip in the low power source voltage.

In order to solve the problem of a long conversion time, the first and second switch controllers CONT1 and CONT2 detect that the input signals DL and DLB change to 0V from the level of the low power source voltage VDDL in accordance with the drain voltages of the first and second NMOS transistors NM1 and NM2, and turn on the first and second switches SW1 and SW2, which are connected to the drains of the first and second NMOS transistors NM1 and NM2, to connect the drain nodes to the high power source voltage VDDH during the signal level conversion. Thereby, it is possible to rapidly change voltages of the drain nodes, i.e., the first and second nodes N1 and N2, to the level of the high power source voltage VDDH.

In other words, when a voltage of the first node N1 changes by variation of the input signal DL from the low power source voltage VDDL to 0V, or when a voltage of the second node N2 changes by variation of the inverted input signal DLB from 0V to the low power source voltage VDDL, the first and second nodes N1 and N2 are connected to the high power source voltage VDDH during the signal level conversion.

Subsequently, when the voltages of the first and second nodes N1 and N2 change to the high power source voltage VDDH, the first and second switch controllers CONT1 and CONT2 turn the first and second switches SW1 and SW2 off.

Figure 1:
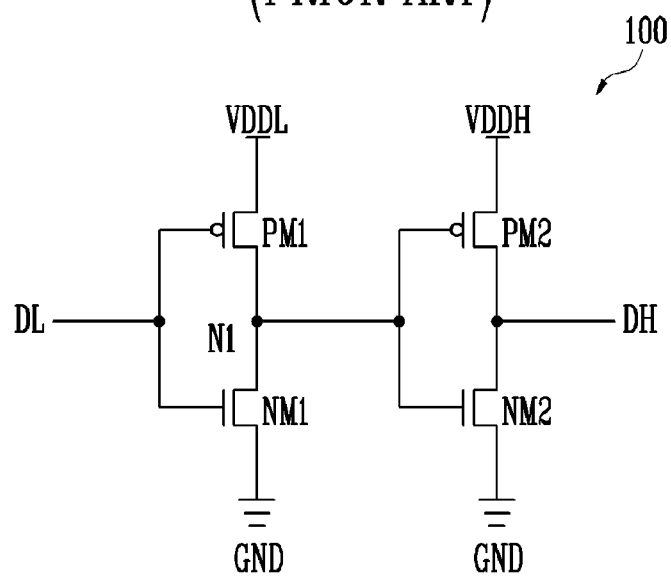
FIG. 1 is a circuit diagram showing the simplest structure of a digital signal level conversion circuit.
Figure 2:
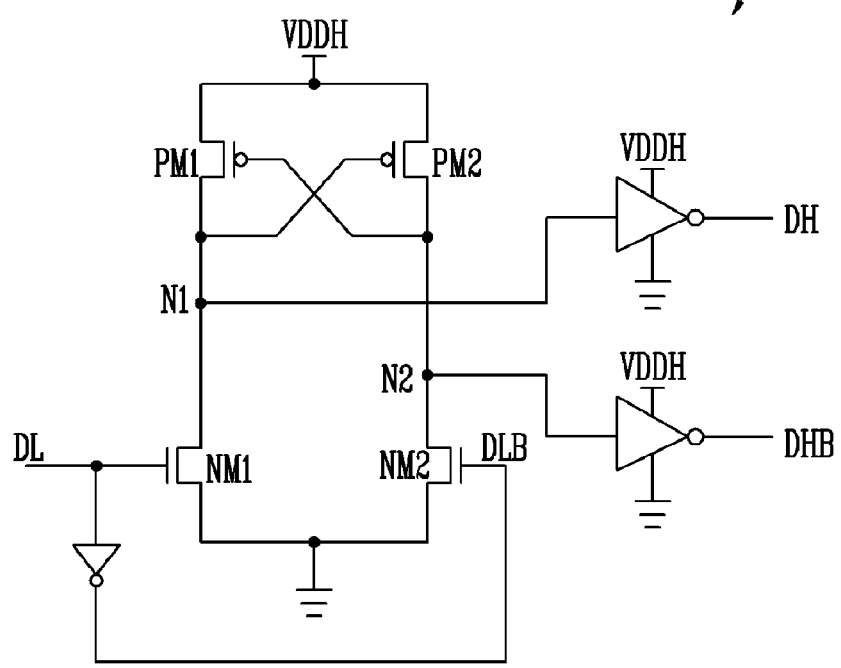
FIG. 2 is a circuit diagram of a conventional digital signal level conversion circuit.
Figure 3:
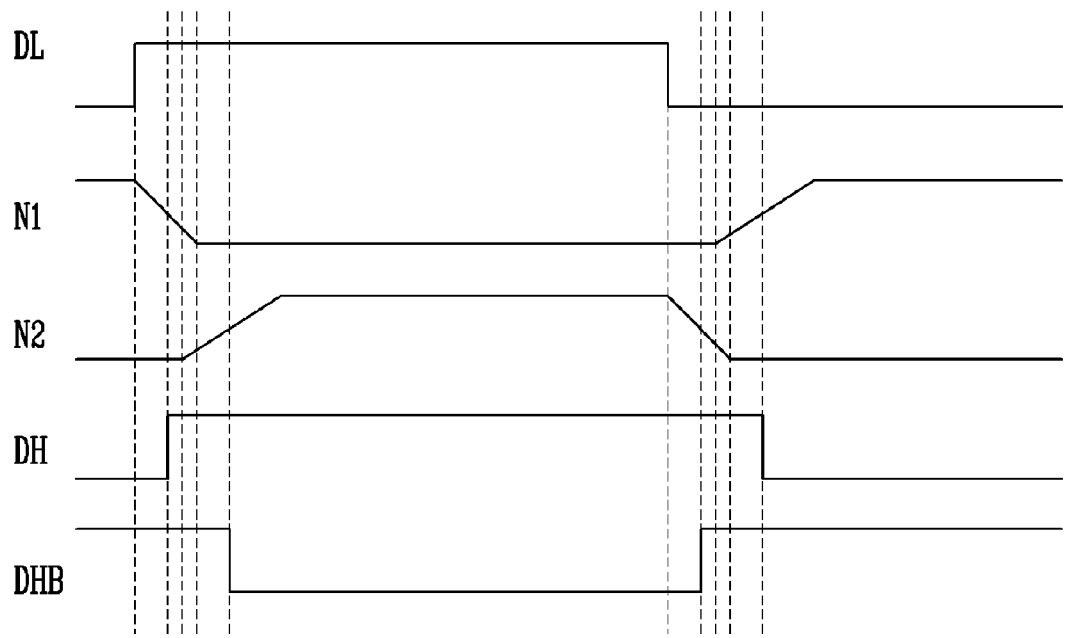
FIG. 3 is a timing diagram of the digital signal level conversion circuit shown in FIG. 2.

By the switching operations, the high-speed asynchronous digital signal level conversion circuit 400 according to the present invention is able to convert a signal level faster than the digital signal level conversion circuit 200 shown in FIG. 2.

Figure 5:
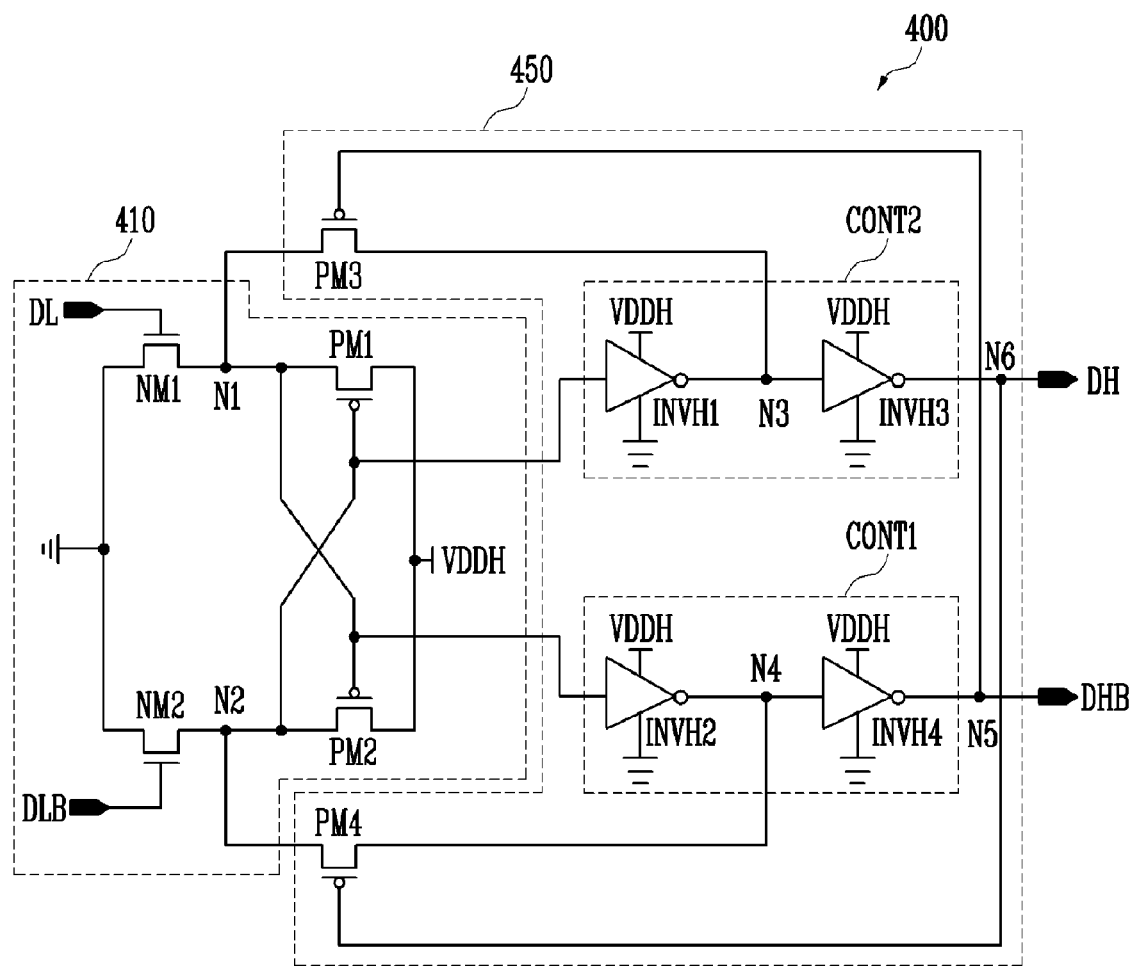
FIG. 5 is a circuit diagram illustrating a practical structure of the high-speed asynchronous digital signal level conversion circuit shown in FIG. 4.

The digital signal level conversion circuit 400 may be practicably embodied as shown in FIG. 5.

FIG. 5 is a circuit diagram illustrating a practical structure of the high-speed asynchronous digital signal level conversion circuit shown in FIG. 4.

Referring to FIG. 5, the first and second switches SW1 and SW2 are formed of third and fourth PMOS transistors, respectively. The first switch controller CONT1 is formed of second and fourth inverters INVH2 and INVH4 connected in series with each other. The second switch controller CONT2 is formed of first and third inverters INVH1 and INVH3 connected in series with each other.

Here, an input of the first switch controller CONT1 is led from the drain of the first NMOS transistor NM1 through the gate of the second PMOS transistor PM2, while an input of the second switch controller CONT2 is led from the drain of the second NMOS transistor NM2 through the gate of the first PMOS transistor PM1.

Gate, drain, and source of the third PMOS transistor PM3 are connected to an output node of the fourth inverter INVH4, an output node N3 of the first inverter INVH1, and the drain of the first NMOS transistor NM1, respectively. Gate, drain, and source of the fourth PMOS transistor PM4 are connected to an output node of the third inverter INVH3, an output node N4 of the second inverter INVH2, and the drain of the second NMOS transistor NM2, respectively.

Namely, the first and second switch controllers CONT1 and CONT2 operate to control the first and second switches SW1 and SW2 by detecting variations in the input signals DL and DLB in response to the voltages of the first and second nodes N1 and N2, i.e., the drain voltages of the first and second NMOS transistors NM1 and NM2, which will be detailed hereinafter.

First, when the low-level digital input signal DL is on the level of the low power source voltage VDDL and the inverted input signal DLB is 0V, the first node N1, the second node N2, the third node N3, the fourth node N4, the output signal DH, and the inverted output signal DHB maintain 0V, the high power source voltage VDDH, 0V, the high power source voltage VDDH, the high power source voltage VDDH, and 0V, respectively.

In this case, while the third PMOS transistor PM3 operating as a switch is turned on because its gate voltage is 0V, its drain and source voltages are 0V to flow no current through the third PMOS transistor PM3. And, while the fourth PMOS transistor PM4 operating as another switch is turned off because its gate voltage is the level of the high power source voltage VDDH, its drain and source voltages are all on the level of the high power source voltage VDDH.

From that, when the low-level digital input signal DL changes to 0V from the level of the low power source voltage VDDL and the inverted input signal DLB changes to the level of the low power source voltage VDDL from 0V, a process of signal conversion is as follows.

First, as the digital input signal DL changes to 0V from the level of the low power source voltage VDDL, the first node N1 is set to high impedance to maintain the voltage thereat. As the inverted input signal DLB changes to the level of the low power source voltage VDDL from 0V, a voltage of the second node N2 goes to 0V.

In this case, as the voltage of the second node N2 turns to 0V, a voltage of the third node N3 changes to the level of the high power source voltage VDDH.

In the state that the third PMOS transistor PM3 is turned on, when the third node N3 changes to the level of the high power source voltage VDDH, a voltage of the first node N1 rapidly rises up to the level of the high power source voltage VDDH through the third PMOS transistor PM3.

As the voltage of the first node N1 changes to the level of the high power source voltage VDDH, a voltage of the fourth node N4 goes to 0V and the inverted output signal DHB turns to the level of the high power source voltage VDDH.

As the inverted output signal DHB turns to the level of the high power source voltage VDDH, the third PMOS transistor PM3 operating as a switch for rapidly changing the voltage of the first node N1 to the level of the high power source voltage VDDH is turned off, and subsequently the entire conversion process of digital signal conversion is terminated.

In summary, by way of the switching operations with the third and fourth PMOS transistors PM3 and PM4 operating as switches, and the first through fourth inverters INVH1~INVH4 controlling the PMOS transistors PM3 and PM4, it is possible to accomplish the digital signal level conversion circuit operable at a higher conversion speed than the CCLC-structured digital signal level conversion circuit shown in FIG. 2.

As described above, since the signal level conversion is carried out at a higher speed than the conventional signal level conversion circuit, it is possible to implement a digital circuit operable at high frequency with multiple power source voltages.

According to the present invention, it is possible to accomplish fast signal level conversion even at a low input voltage while providing a low power digital circuit and chip.

While the invention has been shown and described with reference to certain exemplary embodiments thereof, it will be understood by those skilled in the art that various changes in form and detail may be made therein without departing from the spirit and scope of the invention as defined by the appended claims.

What is claimed is:

1. A high-speed asynchronous digital signal level conversion circuit comprising:

a signal level converter for converting an input signal of a first voltage level into a signal of a second voltage level, the signal level converter including:
   first and second PMOS transistors cross-coupled with each other between the second power source voltage and the first and second nodes; and
   first and second NMOS transistors respectively connected between the first and second nodes and a ground voltage, and respectively receiving the input signal and an inverted input signal through gates; and
a switching circuit for connecting first and second nodes, at which the input signal of the first voltage level is converted to the signal of the second voltage level, to a second power source voltage of the second voltage level for fast voltage level conversion when the voltage level of the input signal is changed, the switching circuit including:
   first and second switch controllers for outputting control signals by detecting variations from the input signal and the inverted input signal in response to drain voltages of the first and second NMOS transistors;
      wherein the first switch controller comprises second and fourth inverters connected in series to the gate of the second PMOS transistor and the drain of the first NMOS transistor, and
      wherein the second switch controller comprises first and third inverters connected in series to the gate of the first PMOS transistor and the drain of the second NMOS transistor; and
   first and second switches respectively connected to drains of the first and second NMOS transistors, and turned on/off in response to the control signals,
      wherein the first switch is a third PMOS transistor and the second switch is a fourth PMOS transistor, and
      wherein gate, drain, and source of the third PMOS transistor are connected to an output of the fourth inverter, an output of the first inverter, and the drain of the first NMOS transistor, respectively, and gate, drain, and source of the fourth PMOS transistor are connected to an output of the third inverter, an output of the second inverter, and the drain of the second NMOS transistor, respectively.

2. The high-speed asynchronous digital signal level conversion circuit according to claim 1,
   wherein the first switch controller turns on the first switch to connect the drain of the first NMOS transistor to the second power source voltage when the drain voltage of the first NMOS transistor is changed in response to voltage level variation of the input signal, and
   wherein the second switch controller turns on the second switch to connect the drain of the second NMOS transistor to the second power source voltage when the drain voltage of the second NMOS transistor is changed in response to voltage level variation of the inverted input signal.

3. The high-speed asynchronous digital signal level conversion circuit according to claim 2,
   wherein the first switch controller turns off the first switch when the drain voltage of the first NMOS transistor is changed to the second power source voltage, and
   wherein the second switch controller turns off the second switch when the drain voltage of the second NMOS transistor is changed to the second power source voltage.

4. A high-speed asynchronous digital signal level conversion circuit comprising:
   a signal level converter for converting an input signal of a first voltage level into a signal of a second voltage level, the signal level converter including:
      first and second PMOS transistors cross-coupled with each other between the second power source voltage and the first and second nodes, and
      first and second NMOS transistors respectively connected between the first and second nodes and a ground voltage, and respectively receiving the input signal and an inverted input signal through gates; and
   a switching circuit for connecting first and second nodes, at which the input signal of the first voltage level is converted to the signal of the second voltage level, to a second power source voltage of the second voltage for fast voltage level conversion when the voltage of the input signal is changed, the switching circuit including:
      first and second switch controllers for outputting control signals by detecting variations from the input signal and the inverted input signal in response to drain voltages of the first and second NMOS transistors; and
      first and second switches respectively connected to drains of the first and second NMOS transistors, and turned on/off in response to the control signals,
         wherein the first switch is a third PMOS transistor and the second switch is a fourth PMOS transistor, and
         wherein gate, drain, and source of the third PMOS transistor are connected to an output of the fourth inverter, an output of the first inverter, and the drain of the first NMOS transistor, respectively, and gate, drain, and source of the fourth PMOS transistor are connected to an output of the third inverter, an output of the second inverter, and the drain of the second NMOS transistor, respectively.

* * * * *